(12) United States Patent
Eggers

(10) Patent No.: US 10,895,619 B2
(45) Date of Patent: Jan. 19, 2021

(54) MR IMAGING WITH DIXON-TYPE WATER/FAT SEPARATION

(71) Applicant: KONINKLIJKE PHILIPS N.V., Eindhoven (NL)

(72) Inventor: Holger Eggers, Ellerhoop (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 16/463,399

(22) PCT Filed: Nov. 24, 2017

(86) PCT No.: PCT/EP2017/080286
§ 371 (c)(1),
(2) Date: May 23, 2019

(87) PCT Pub. No.: WO2018/096073
PCT Pub. Date: May 31, 2018

(65) Prior Publication Data
US 2019/0310336 A1    Oct. 10, 2019

(30) Foreign Application Priority Data

Nov. 24, 2016   (EP) .................................. 16200449

(51) Int. Cl.
*G01R 33/48* (2006.01)
*G01R 33/54* (2006.01)
*G01R 33/561* (2006.01)

(52) U.S. Cl.
CPC ....... *G01R 33/4828* (2013.01); *G01R 33/543* (2013.01); *G01R 33/5611* (2013.01); *G01R 33/5617* (2013.01); *G01R 33/561* (2013.01); *G01R 33/5615* (2013.01)

(58) Field of Classification Search
CPC ............ G01R 33/4828; G01R 33/5611; G01R 33/5617; G01R 33/561; G01R 33/5615
See application file for complete search history.

(56) References Cited

U.S. PATENT DOCUMENTS

| 4,952,876 A | 8/1990 | Pelc |
|---|---|---|
| 7,027,853 B2 | 4/2006 | Ma |

(Continued)

FOREIGN PATENT DOCUMENTS

| KR | 20010074353 A | 8/2001 |
|---|---|---|
| WO | 2011080693 A1 | 7/2011 |

OTHER PUBLICATIONS

Eggers et al "Dual Echo Dixon Imaging With Flexible Choice of Echo Times" Magnetic Resonance in Imaging, 65, p. 96-107 (2011).

(Continued)

*Primary Examiner* — Gregory H Curran

(57) ABSTRACT

The invention relates to a method of Dixon-type MR imaging. It is an object of the invention to provide a method that enables Dixon water/fat separation with high SNR and with improved noise propagation in the water/fat separation. The method comprises the steps of: —subjecting an object (10) to a first imaging sequence, which generates a number of differently phase encoded first MR echo signals at a first echo time, such that contributions from MR signals emanating from water protons and MR signals emanating from fat protons to the first MR echo signals are essentially in phase, —acquiring the first MR echo signals using a first signal receiving bandwidth, —subjecting the object (10) to a second imaging sequence which generates a number of differently phase encoded second MR echo signals at a second echo time, such that contributions from MR signals emanating from water protons and MR signals emanating from fat protons to the second MR echo signals are at least partially out of phase, —acquiring the second MR echo signals using a second signal receiving bandwidth which is larger than the first receiving bandwidth, wherein the number of phase encodings of the first imaging sequence is smaller than the number of phase encodings of the second imaging sequence, and —reconstructing a MR image from (Continued)

the first and second MR echo signals, whereby signal contributions from water protons and fat protons are separated. Moreover the invention relates to a MR device and to a computer program to be run on a MR device.

12 Claims, 3 Drawing Sheets

(56) References Cited

U.S. PATENT DOCUMENTS

| | | | |
|---|---|---|---|
| 2009/0185981 A1* | 7/2009 | Karczmar | A61B 5/055 |
| | | | 424/9.3 |
| 2013/0214783 A1 | 8/2013 | Zhao | |
| 2014/0292325 A1* | 10/2014 | Heule | G01R 33/448 |
| | | | 324/309 |
| 2015/0253403 A1* | 9/2015 | Grissom | G01R 33/4831 |
| | | | 324/309 |
| 2016/0033605 A1 | 2/2016 | Stemmer et al. | |
| 2016/0033606 A1 | 2/2016 | Eggers | |

OTHER PUBLICATIONS

Pruessmann et al "Sense: Sensitivity Encoding for Fast MRI" Magnetic Resonance in Medicine, John Wiley & Sons, Inc, US, vol. 42, No. 5, Nov. 1, 1999 (Nov. 1, 1999), pp. 952-962.
Liu et al "Note: Compressed Sensing MRI Conbined With Sense in Partial K-Space . . . " Physics in Medicine and Biology, vol. 57, No. 21, Oct. 16, 2012 p. N-391-403.
Search Report dated Feb. 2, 2018.

* cited by examiner a)

b)

a)

b)

MR IMAGING WITH DIXON-TYPE WATER/FAT SEPARATION

CROSS REFERENCE TO RELATED APPLICATIONS

This application is a U.S. national phase application of International Application No. PCT/EP2017/080286 filed on Nov. 24, 2017, which claims the benefit of EP Application Serial No. 16200449.3 filed on Nov. 24, 2016 and is incorporated herein by reference.

FIELD OF THE INVENTION

The invention relates to the field of magnetic resonance (MR) imaging. It concerns a method of MR imaging of a portion of a body placed in the examination volume of a MR device. The invention also relates to a MR device and to a computer program to be run on a MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field $B_0$ whose direction at the same time defines an axis (normally the z-axis) of the co-ordinate system on which the measurement is based. The magnetic field $B_0$ produces different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse) while the magnetic field $B_0$ extends perpendicular to the z-axis, so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the spins are deflected from the z axis to the transverse plane (flip angle 90°).

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second time constant $T_2$ (spin-spin or transverse relaxation time). The variation of the magnetization can be detected by means of receiving RF coils which are arranged and oriented within an examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneities) from an ordered state with the same phase to a state in which all phase angles are uniformly distributed (dephasing). The dephasing can be compensated by means of a refocusing pulse (for example a 180° pulse). This produces an echo signal (spin echo) in the receiving coils.

In order to realize spatial resolution in the body, constant magnetic field gradients extending along the three main axes are superposed on the uniform magnetic field $B_0$, leading to a linear spatial dependency of the spin resonance frequency. The signal picked up in the receiving coils then contains components of different frequencies which can be associated with different locations in the body. The signal data obtained via the receiving coils correspond to the spatial frequency domain and are called k-space data. The k-space data usually include multiple lines (referred to as k-space lines or profiles) acquired with different phase encoding. Each line is digitized by collecting a number of samples. A set of k-space data is converted to an MR image by means of Fourier transformation.

In MR imaging, it is often desired to obtain information about the relative contribution of water and fat to the overall signal, either to suppress the contribution of one of them or to separately or jointly analyze the contribution of all of them. These contributions can be calculated if information from two or more corresponding echoes, acquired at different echo times, is combined. This may be considered as chemical shift encoding, in which an additional dimension, the chemical shift dimension, is defined and encoded by acquiring a couple of images at slightly different echo times. For water/fat separation, these types of experiments are often referred to as Dixon-type of measurements. By means of Dixon imaging or Dixon water/fat imaging, a water/fat separation can be achieved by calculating contributions of water and fat from two or more corresponding echoes, acquired at different echo times. In general such a separation is possible because there is a known precessional frequency difference of hydrogen in fat and water. In its simplest form, water and fat images are generated by either addition or subtraction of the "in phase" and "out of phase" datasets. Several Dixon-type MR imaging methods have been proposed in recent years. Apart from different strategies for the water/fat separation, the known techniques are mainly characterized by the specific number of echoes (or points) they acquire and by the constraints that they impose on the used echo times. Conventional so-called two- and three-point methods require in phase and opposed-phase echo times at which the water and fat signals are parallel and antiparallel in the complex plane, respectively. Three-point methods have gradually been generalized to allow flexible echo times. Thus, they do not restrict the angle or phase between the water and fat signals at the echo times to certain values anymore. In this way, they provide more freedom in imaging sequence design and enable in particular a trade-off between signal-to-noise ratio (SNR) gains from the acquisition and SNR losses in the separation. Sampling only two instead of three echoes is desirable to reduce scan time. However, constraints on the echo times may actually render dual-echo acquisitions slower than triple-echo acquisitions. Eggers et al. (Magnetic Resonance in Medicine, 65, 96-107, 2011) have proposed a dual-echo flexible Dixon-type MR imaging method which enables the elimination of such constraints. Using such Dixon-type MR imaging methods with more flexible echo times, in phase and opposed-phase images are no longer necessarily acquired, but optionally synthesized from water and fat images.

Dixon-type MR imaging methods are often applied in combination with fast (turbo) spin echo sequences using multiple repetition or multiple acquisition approaches. Typically, two or three interleaved measurements with shifted readout magnetic field gradients and acquisition windows are employed. According to the shifting of the readout magnetic field gradients, different phase offsets of the signal contributions from water protons and fat protons, respectively, are obtained on which the Dixon-type water/fat separation is based.

The in phase and out of phase images acquired in the known Dixon-type MR imaging methods suffer from a poor SNR as compared to the water and fat images obtained with these methods. This is due to an averaging effect commonly quantified by the effective number of signal averages (NSA) from which the water and fat images resulting from the Dixon water/fat separation usually benefit, but not the acquired in phase and out of phase images. Moreover, the in phase images acquired in the known Dixon-type MR imaging methods suffer from a poor SNR as compared to in phase images acquired by means of separate, tailored, non-Dixon-type MR imaging methods. A comparable SNR would often only be achievable in prohibitively long scan times.

This issue is addressed in US 2016/0033606 A1 by acquiring the in phase signals and the (partially) out of phase signals with unequal SNR. Two separate turbo spin echo imaging sequences are used to acquire the in phase and the out of phase signals respectively. The in phase signals are acquired with lower readout magnetic resonance gradient strength and lower signal receiving bandwidth and thus with higher SNR than the out of phase signals. The (fat-suppressed) water images reconstructed from the in phase and out of phase signals benefit from the higher SNR in the acquired in phase signals. In this way, a higher SNR is achieved in the acquired in phase images and in the calculated water (fat-suppressed) images in the same scan time, or a comparable SNR in a shorter scan time. However, a drawback of this known approach is that the variation of the receiving bandwidth leads to an unequal SNR in the two sub-acquisitions and thus to an unfavorable noise propagation in the water/fat separation.

SUMMARY OF THE INVENTION

From the foregoing it is readily appreciated that there is a need for an improved technique for Dixon-type MR imaging. It is consequently an object of the invention to provide a method that enables Dixon water/fat separation with high SNR and with improved noise propagation in the water/fat separation.

In accordance with the invention, a method of MR imaging of an object placed in an examination volume of a MR device is disclosed. The method comprises the following steps:

subjecting the object to a first imaging sequence, which generates a number of differently phase encoded first MR echo signals at a first echo time, such that contributions from MR signals emanating from water protons and MR signals emanating from fat protons to the first MR echo signals are essentially in phase, acquiring the first MR echo signals using a first signal receiving bandwidth, subjecting the object to a second imaging sequence which generates a number of differently phase encoded second MR echo signals at a second echo time, such that contributions from MR signals emanating from water protons and MR signals emanating from fat protons to the second MR echo signals are at least partially out of phase, acquiring the second MR echo signals using a second signal receiving bandwidth which is larger than the first receiving bandwidth, wherein the number of phase encodings of the first imaging sequence is smaller than the number of phase encodings of the second imaging sequence, and reconstructing a MR image from the first and second MR echo signals, whereby signal contributions from water protons and fat protons are separated.

According to the invention, the number of phase encodings (i.e., the number of k-space lines/profiles) in the acquisition of the in phase signals is smaller than the number of phase encodings in the acquisition of the (partially) out of phase signals. The reduction of the number of phase encodings correspondingly reduces the SNR in an MR image reconstructed from the first (in phase) MR echo signals. This enables tailoring the SNR in the in phase and water (or fat-suppressed) images individually as required, by adapting the SNR in the MR image reconstructed from the first (in phase) MR echo signals relative to the SNR in an MR image reconstructed from the second ((partially) out of phase) MR echo signals. Preferably, the number of phase encodings of the first and second imaging sequences are chosen such that the SNR in the MR image reconstructed from the first (in phase) MR echo signals is essentially equal to the SNR in the MR image reconstructed from the second ((partially) out of phase) MR echo signals.

In this way, the invention achieves an improved noise propagation in the water/fat separation and, simultaneously, a reduced overall scan time.

More specifically, the first MR echo signals are acquired using a readout magnetic field gradient having a first gradient strength, and the second MR echo signals are acquired using a readout magnetic field gradient having a second gradient strength which is larger than the first gradient strength. Simultaneously, the first MR echo signals are acquired using a signal receiving bandwidth which is smaller than the signal receiving bandwidth used for the acquisition of the second MR echo signals. Like in the above-mentioned US 2016/0033606 A1, the whole acquisition is split up into two, usually interleaved sub-acquisitions, performed with a low-bandwidth sub-sequence (the first imaging sequence) and a high-bandwidth sub-sequence (the second imaging sequence), respectively. In the low-bandwidth sub-sequence, a high signal sampling efficiency is achieved by sampling the first MR echo signals during most of the interspacing between the refocusing RF pulses. This low-bandwidth and high sampling efficiency yields a high SNR. The low-bandwidth first imaging sequence has a fixed first echo time, at which water and fat signals are in phase. The high-bandwidth second imaging sequence has an adjustable second echo time, at which water and fat signals are at least partially out of phase. The second imaging sequence achieves only a lower sampling efficiency and provides a lower SNR, since it has to cover the same gradient integral in less time to obtain the echo shift required for subsequent Dixon water/fat separation based on both sub-sequences.

According to a preferred embodiment of the invention, each of the first and second imaging sequences are repeated, partially or entirely, for signal accumulation, wherein the number of repetitions of the first imaging sequence may be different from the number of repetitions of the second imaging sequence. Selectively repeating the first and second imaging sequences respectively can be used in order to further tailor the SNR in the in phase, water, and fat images individually, including improving it in the in phase images and equalizing it in the in phase and water images. Simultaneously, the overall scan time can be kept within acceptable limits.

In yet another preferred embodiment, the first and second imaging sequences are turbo spin echo (TSE) sequences, each shot of the first and second imaging sequences comprising one RF excitation pulse for exciting magnetic resonance within the object and two or more refocusing RF pulses for refocusing magnetic resonance, such that a train of differently phase encoded MR echo signals is generated by each shot. In other words, the method of the invention is preferably applied in combination with a multi-shot multi-echo approach. A number of shots using interleaved k-space sampling with shifted readout magnetic field gradients and acquisition windows are employed. According to the shifting of the readout magnetic field gradients, different phase offsets of the signal contributions from water protons and fat protons, respectively, are obtained on which the Dixon-type water/fat separation can be based.

As mentioned above, the phase encoding schemes of the individual shots are preferably chosen such that k-space is sampled in an interleaved fashion by the shots of each of the first and second imaging sequences. Each of the MR signals from the respective train of echo signals represents a k-space line, i.e. a one-dimensional sampling of k-space, the position of which being determined by the applied phase encoding switched magnetic field gradients of the sequence. The so-called 'Turbo Factor' (TF) is the number of echoes acquired after each RF excitation pulse. A plurality of shots of the multi-echo sequence is applied for completely sampling k-space in order to be able to reconstruct a MR image from the acquired k-space lines. K-space is typically segmented such that each segment is attributed to one echo index number in the train of echoes generated by each shot of the sequence. In other words, each shot typically acquires k-space profiles from all segments of k-space with the number of segments in k-space being equal to TF.

As the object is subjected to multiple shots of the first and second imaging sequences, the number of shots of the first imaging sequence may be chosen to be smaller than the number of shots of the second imaging sequence. In this way, a smaller number of phase encodings of the first imaging sequence than the number of phase encodings of the second imaging sequence within the meaning of the invention can be obtained.

Preferably, the echo orders of the first and second imaging sequences are chosen such that first and second MR echo signals acquired from a central position in k-space have identical or adjacent echo index numbers, the echo index number indicating the position of each MR echo signal in the train of echo signals generated by each shot of the first or second imaging sequence. By choosing the echo orders in this way, the contrast in the in phase and (partially) out of phase images can be kept as similar as possible.

A smaller number of phase encodings of the first imaging sequence in comparison to the number of phase encodings of the second imaging sequence can also be obtained by acquiring at least the first MR echo signals with sub-sampling of k-space. In order to avoid aliasing in the reconstructed MR image, conventional parallel imaging techniques may be employed. At least the first MR echo signals may be acquired in parallel via a number of RF coils having different spatial sensitivity profiles, wherein the MR image is then reconstructed using a parallel imaging reconstruction algorithm, like SENSE or SMASH. Alternatively, the MR image may reconstructed from the sub-sampled MR signal data using a per se known compressed sensing reconstruction algorithm.

In a preferred embodiment of the invention, the phase encoding scheme of the first imaging sequence is chosen such that k-space is incompletely sampled using a partial Fourier technique. By applying a partial Fourier technique to the acquisition of the first MR echo signals a corresponding reduction of the number of phase encodings of the first imaging sequence in comparison to the number of phase encodings of the second imaging sequence can be obtained. The partial Fourier technique exploits the symmetry of the MR signal data in k-space to reduce the number of phase encodings (and correspondingly the required acquisition time) by sampling only an asymmetric part of k-space. The symmetry in k-space is a basic property of Fourier transformation and is called Hermitian symmetry. Thus, from the known symmetry properties for the MR signal data a full MR image can be reconstructed from the MR signal data from only one half of k-space. The conditions under which Hermitian symmetry holds and the corrections that must be applied when the assumption is not strictly obeyed must be considered. A prerequisite for partial Fourier imaging is that phase shifts are slowly varying across the object. In this regard, the invention takes advantage from the typically very smooth spatial variation of the phase in the in phase TSE image data. However, to avoid problems due to slowly varying phase shifts, a little more than one half of k-space should be covered by the first imaging sequence. Preferably, both (positive and negative) sides of k-space (in the phase encoding direction) are acquired in a low spatial frequency range while at higher spatial frequencies the MR signal data are acquired only on one side. The fully sampled low frequency portion can be used to characterize (and correct for) any slowly varying phase shifts.

The method of the invention described thus far can be carried out by means of a MR device including at least one main magnet coil for generating an essentially uniform, steady magnetic field $B_0$ within an examination volume, a number of gradient coils for generating switched magnetic field gradients in different spatial directions within the examination volume, at least one body RF coil for generating RF pulses within the examination volume and/or for receiving MR signals from a body of a patient positioned in the examination volume, a control unit for controlling the temporal succession of RF pulses and switched magnetic field gradients, and a reconstruction unit for reconstructing MR images from the received MR signals. The method of the invention can be implemented by a corresponding programming of the reconstruction unit and/or the control unit of the MR device.

The method of the invention can be advantageously carried out on most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF THE EMBODIMENTS

Figure 1:
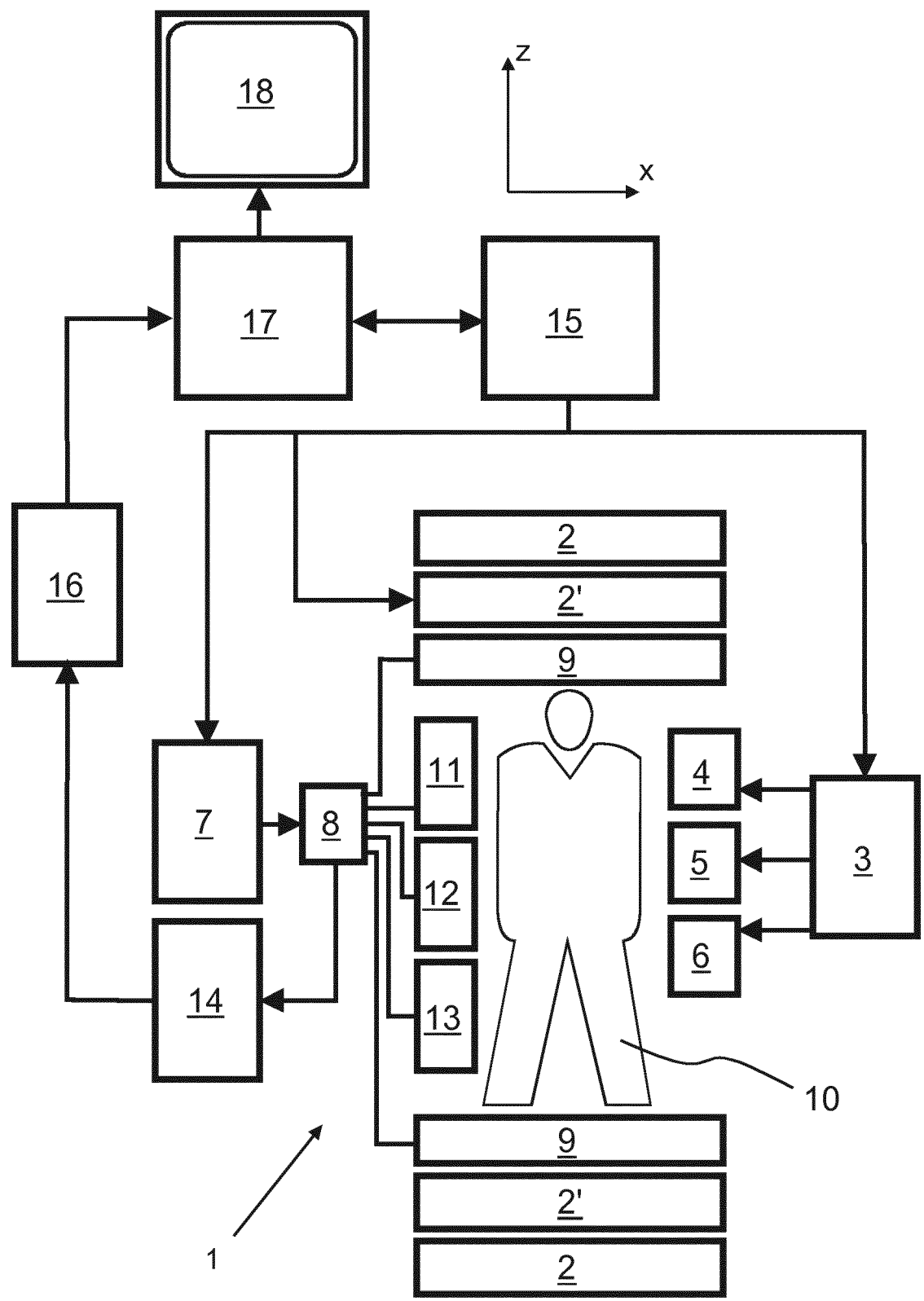
FIG. 1 shows a MR device for carrying out the method of the invention.

With reference to FIG. 1, a MR device 1 is shown. The device comprises superconducting or resistive main magnet coils 2 such that a substantially uniform, temporally constant main magnetic field $B_0$ is created along a z-axis through an examination volume. The device further comprises a set of ($1^{st}$, $2^{nd}$, and—where applicable—$3^{rd}$ order) shimming coils 2', wherein the current flow through the individual shimming coils of the set 2' is controllable for the purpose of minimizing $B_0$ deviations within the examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send/receive switch 8, to a body RF coil 9 to transmit RF pulses into the examination volume. A typical MR imaging sequence is composed of a packet of RF pulse segments of short duration which, together with any applied magnetic field gradients, achieve a selected manipulation of nuclear magnetic resonance. The RF pulses are used to saturate, excite resonance, invert magnetization, refocus resonance, or manipulate resonance and select a portion of a body 10 positioned in the examination volume. The MR signals are also picked up by the body RF coil 9.

For generation of MR images of limited regions of the body 10, a set of local array RF coils 11, 12, 13 are placed contiguous to the region selected for imaging. The array coils 11, 12, 13 can be used to receive MR signals induced by body-coil RF transmissions.

The resultant MR signals are picked up by the body RF coil 9 and/or by the array RF coils 11, 12, 13 and demodulated by a receiver 14 preferably including a preamplifier (not shown). The receiver 14 is connected to the RF coils 9, 11, 12 and 13 via send/receive switch 8.

A host computer 15 controls the shimming coils 2' as well as the gradient pulse amplifier 3 and the transmitter 7 to generate the imaging sequences of the invention. For the selected sequence, the receiver 14 receives a single or a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data are reconstructed into an image representation by a reconstruction processor 17 which applies a Fourier transform or other appropriate reconstruction algorithms, such as SENSE. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

The host computer 15 and the reconstruction processor 17 are arranged, typically by software, to perform the method of the invention described above and in the following.

As explained above, separate imaging sequences are employed according to the invention, referred to as first and second imaging sequences, to acquire in phase (first MR signals) and (partially) out of phase signals (second MR signals) from water and fat protons.

FIG. 2a shows a pulse sequence diagram of a turbo spin echo (TSE) sequence constituting a first imaging sequence of the method according to the invention. The depicted sequence is optimized to provide in phase MR signals from water and fat protons with high SNR. The diagram shows switched magnetic field gradients in the frequency-encoding direction (M), the phase-encoding direction (P) and the slice-selection direction (S). Moreover, the diagram shows the RF excitation and refocusing pulses as well as the time intervals during which first MR echo signals are acquired, designated by ACQ1. To yield in phase images with high SNR by the sequence shown in FIG. 2a, a comparatively weak readout gradient (in the M-direction) and a low signal receiving bandwidth are chosen. A high sampling efficiency is reached in the first imaging sequence by sampling the MR signals during most of the interspacing between the refocusing pulses.

FIG. 2b shows a schematic pulse sequence diagram for the second imaging sequence within the meaning of the invention. The second imaging sequence is also a TSE sequence with echo shifting to obtain (partially) out of phase signals. The signal acquisition periods are indicated by ACQ2 in FIG. 2b. In the depicted example, the spacing between the MR echo signals is kept constant, while the readout gradient strength as well as the receiving signal bandwidth are doubled with respect to the first imaging sequence to enable echo shifting. If the readout gradient strength and the signal receiving bandwidth were kept constant instead, the spacing between the MR echo signals would have to be increased, resulting in an increased scan time, among others.

Figure 2:
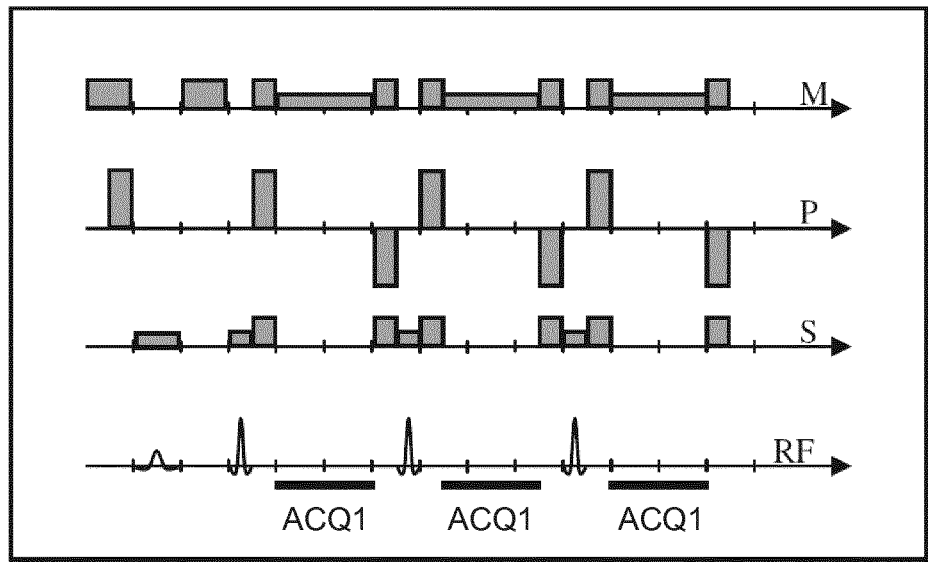
FIG. 2 shows time diagrams illustrating the signal acquisition scheme of the invention.
Figure 2:
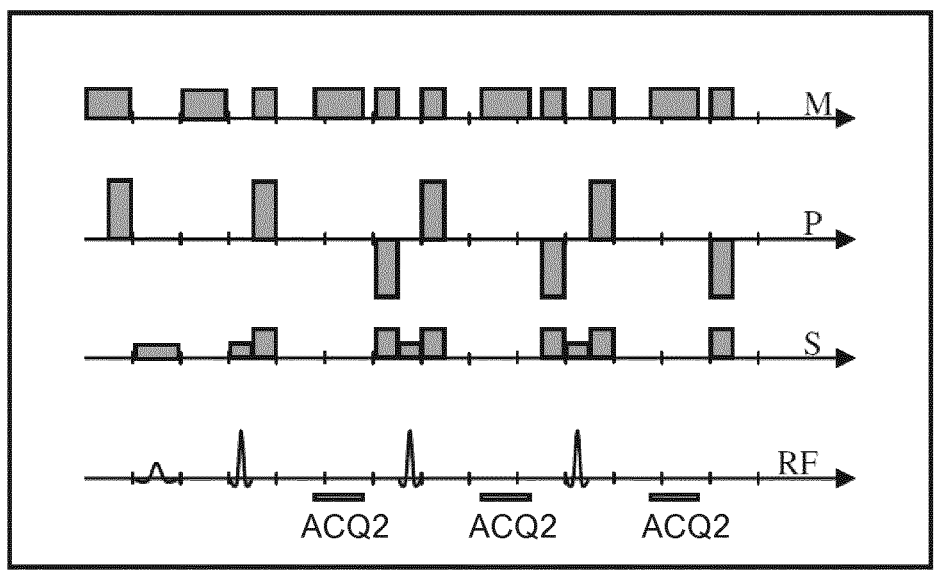

The acquisition scheme illustrated in FIG. 2 comprises the acquisition of in phase signals by the first imaging sequence (FIG. 2a) with high SNR, high scan efficiency, and optionally multiple averages, and the acquisition of (partially) out of phase signals by the second imaging sequence (FIG. 2b) with lower SNR, lower scan efficiency, and optionally more averages.

In the reconstruction step of the method of the invention, in phase images, out of phase images, (fat-suppressed) water images and/or fat images may be obtained from the acquired in phase and (partially) out of phase signals by per se known reconstruction algorithms.

The afore-described variation of the readout gradient strength and the receive bandwidth between the two sub-acquisitions leads to an unequal SNR in the measured in phase (IP) and partially out of phase (POP) images, which can be described by the covariance matrix:

$$C_{IP,POP} = \begin{bmatrix} \sigma_{IP}^2 & 0 \\ 0 & \sigma_{POP}^2 \end{bmatrix}$$

The effective number of signal averages for the corresponding water and fat images is then given by:

$$NSA_{W,F} = \frac{2(1-\cos(\theta))}{1+\sigma_{IP}^2/\sigma_{POP}^2}$$

Therein the higher noise variance in the measured out of phase image is taken as a reference. θ denotes the phase offset of the fat signal with respect to the water signal, accumulated between the in phase and the partially out of phase echoes due to the difference in chemical shift. For the sake of simplicity, the local main magnetic field inhomogeneity is assumed to be known exactly, the fat spectrum is reduced to a single peak, and transverse relaxation is neglected.

The corresponding effective number of signal averages for the in phase image is:

$$NSA_{IP} = \sigma_{IP}^2/\sigma_{POP}^2$$

The IP image is therein assumed to be obtained by a complex addition of the water and fat images, without correction of the fat shift. With a correction of the fat shift, the noise in the synthesized IP image may increase, i.e. the SNR may be lower than in the measured IP image.

From the above equations it follows that an increase in the SNR in the IP image has only a limited benefit for the SNR in the water and fat images. Therefore, an acceleration of the sub-acquisition of the IP image is suggested according to the invention by reducing the number of phase encodings in the acquisition of the first (IP) MR echo signals in relation to the number of phase encodings in the acquisition of the second (POP) MR echo signals, with the aim of equalizing the SNR in the IP and POP images, while simultaneously decreasing the overall scan time.

Preferably, half Fourier imaging is applied for this purpose. Since the IP image in TSE imaging typically exhibits a very smooth spatial variation of the phase, half Fourier imaging can be used in the sub-acquisition of the IP image, without causing unacceptable image artifacts.

Figure 3:
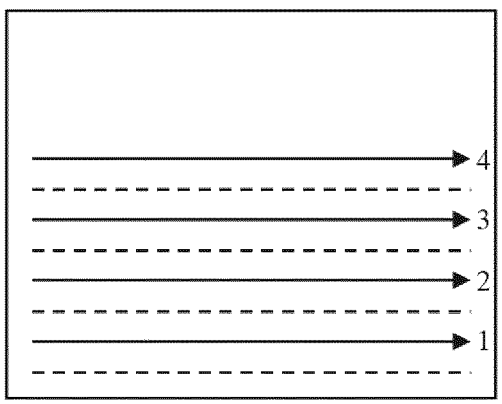
FIG. 3 schematically shows different schemes of partial Fourier acquisition of the in phase signal data according to the invention
Figure 3:
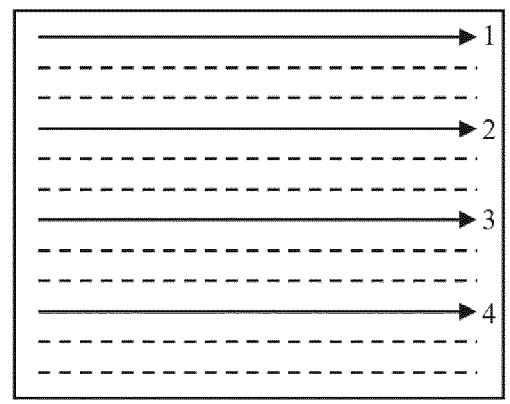
Figure 3:
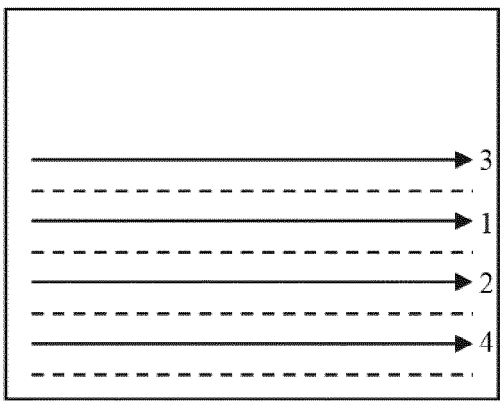
Figure 3:
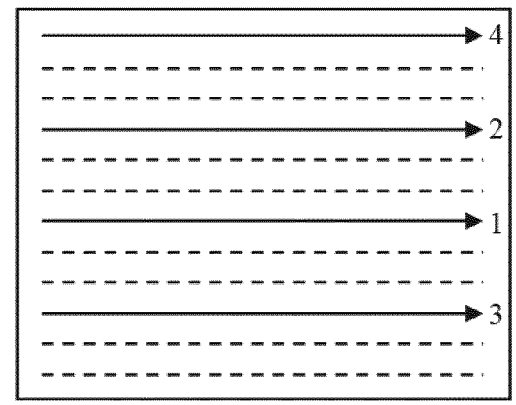

This is illustrated in FIG. 3. FIG. 3 shows diagrams of k-space. The left diagrams show the acquisition of the IP MR echo signals. The right diagrams show the acquisition of the POP MR echo signals. The turbo factor equals 4 in both sub-acquisitions. The numbers in the diagrams indicate the echo index numbers attributed to the individual k-space lines. The IP signals are acquired in two TSE shots and the POP signals are acquired in three TSE shots. Hence, the sub-acquisition of the IP image is accelerated by a factor of 1.5 and the SNR in the IP image is correspondingly reduced by a factor of 0.82 in relation to the POP image. The depicted half Fourier technique preserves the spatial resolution, but it may alter the contrast of the TSE imaging. Therefore, a variation of the profile order between the two sub-acquisitions is suggested to keep the contrast in the IP and POP images as similar as possible. For this purpose, the effective echo time should be matched in the two sub-acquisitions. This is illustrated in FIG. 3a where half Fourier imaging and a "linear" multi-shot profile order is shown. The contrasts in the IP image and the POP image are approximately matched by sampling the central k-space profile with the third echo in the TSE train in both sub-acquisitions. FIG. 3b shows a similar example using a "low-high" multi-shot echo order. In general, there is more flexibility to match the contrast in the IP image and the POP image with increasing number of TSE shots, i.e. with an increasing segmentation of the acquisition, and with higher dimension of the phase encoding space, e.g. in 3D TSE imaging. The same holds for more random distributions of the collected profiles, e.g. in combination with compressed sensing. This flexibility can be exploited to not only equalize the echo order for the central k-space line(s), but also to consider blurring caused by $T_2$ relaxation, among others.

The invention claimed is:

1. A method of magnetic (MR) imaging of an object placed in an examination volume of a MR device, the method comprising:
   subjecting the object to a first imaging sequence, which generates a number of differently phase encoded first MR echo signals at a first echo time, such that contributions from MR signals emanating from water protons and MR signals emanating from fat protons to the first MR echo signals are essentially in phase,
   acquiring the first MR echo signals using a first signal receiving bandwidth, wherein the first MR echo signals are acquired using a readout magnetic field gradient having a first gradient strength,
   subjecting the object to a second imaging sequence which generates a number of differently phase encoded second MR echo signals at a second echo time, such that contributions from MR signals emanating from water protons and MR signals emanating from fat protons to the second MR echo signals are at least partially out of phase,
   acquiring the second MR echo signals using a second signal receiving bandwidth which is larger than the first receiving bandwidth, wherein the second MR echo signals are acquired using a readout magnetic field gradient having a second gradient strength which is different from the first gradient strength, wherein the number of different phase encodings of the first imaging sequence is smaller than the number of different phase encodings of the second imaging sequence, and
   reconstructing a MR image from the first and second MR echo signals, whereby signal contributions from water protons and fat protons are separated.

2. The method of claim 1, wherein the number of phase encodings of the first and second imaging sequences are chosen such that the signal-to-noise ratio of an MR image reconstructed from the first MR echo signals is essentially equal to the signal-to-noise ratio of an MR image reconstructed from the second MR echo signals.

3. The method of claim 1, wherein the first and second imaging sequences are turbo spin echo sequences, each shot of the first and second imaging sequences comprising one RF excitation pulse for exciting magnetic resonance within the object and two or more refocusing RF pulses for refocusing magnetic resonance, such that a train of differently phase encoded MR echo signals is generated by each shot.

4. The method of claim 3, wherein the object is subjected to multiple shots of the first and second imaging sequences, wherein the number of shots of the first imaging sequence is smaller than the number of shots of the second imaging sequence.

5. The method of claim 4, wherein the phase encoding schemes of the individual shots are chosen such that k-space is sampled in an interleaved fashion by the shots of each of the first and second imaging sequences.

6. The method of claim 5, wherein the echo orders of the first and second imaging sequences are chosen such that first and second MR echo signals acquired from a central position in k-space have identical or adjacent echo index numbers, the echo index number indicating the position of each MR echo signal in the train of echo signals generated by each shot of the first or second imaging sequence.

7. The method of claim 1, wherein at least the first MR echo signals are acquired with sub-sampling of k-space.

8. The method of claim 7, wherein at least the first MR echo signals are acquired in parallel via a number of RF coils having different spatial sensitivity profiles, wherein the MR image is reconstructed using a parallel imaging reconstruction algorithm, like SENSE or SMASH.

9. The method of claim 7, wherein the MR image is reconstructed using a compressed sensing reconstruction algorithm.

10. The method of claim 1, wherein the phase encoding scheme of the first imaging sequence is chosen such that k-space is incompletely sampled using a partial Fourier technique.

11. A magnetic resonance (MR) device for carrying out the method claimed in claim 1, which MR device includes at least one main magnet coil for generating a uniform, steady magnetic field $B_0$ within an examination volume, a number of gradient coils for generating switched magnetic field gradients in different spatial directions within the examination volume, at least one RF coil for generating RF pulses within the examination volume and/or for receiving MR signals from an object positioned in the examination volume, a control unit for controlling the temporal succession of RF pulses and switched magnetic field gradients, and a reconstruction unit for reconstructing MR images from the received MR signals, wherein the MR device is arranged to perform the following steps:

subjecting the object to a first imaging sequence, which generates a number of differently phase encoded first MR echo signals at a first echo time, such that contributions from MR signals emanating from water protons and MR signals emanating from fat protons to the first MR echo signals are essentially in phase, acquiring the first MR echo signals using a first signal receiving bandwidth, wherein the first MR echo signals are acquired using a readout magnetic field gradient having a first gradient strength, subjecting the object to a second imaging sequence which generates a number of differently phase encoded second MR echo signals at a second echo time, such that contributions from MR signals emanating from water protons and MR signals emanating from fat protons to the second MR echo signals are at least partially out of phase, and acquiring the second MR echo signals using a second signal receiving bandwidth which is larger than the first receiving bandwidth, wherein the second MR echo signals are acquired using a readout magnetic field gradient having a second gradient strength which is different from the first gradient strength, wherein the number of different phase encodings of the first imaging sequence is smaller than the number of different phase encodings of the second imaging sequence, and reconstructing a MR image from the first and second MR echo signals, whereby signal contributions from water protons and fat protons are separated.

12. A computer program stored on a non-transitory computer readable medium to be run on a magnetic resonance (MR) device, which computer program comprises instructions for:

performing a first imaging sequence, which generates a number of differently phase encoded first MR echo signals at a first echo time, such that contributions from MR signals emanating from water protons and MR signals emanating from fat protons to the first MR echo signals are essentially in phase, acquiring the first MR echo signals using a first signal receiving bandwidth, wherein the first MR echo signals are acquired using a readout magnetic field gradient having a first gradient strength, performing a second imaging sequence which generates a number of differently phase encoded second MR echo signals at a second echo time, such that contributions from MR signals emanating from water protons and MR signals emanating from fat protons to the second MR echo signals are at least partially out of phase, acquiring the second MR echo signals using a second signal receiving bandwidth which is larger than the first receiving bandwidth, wherein the second MR echo signals are acquired using a readout magnetic field gradient having a second gradient strength which is different from the first gradient strength, wherein the number of different phase encodings of the first imaging sequence is smaller than the number of different phase encodings of the second imaging sequence, and reconstructing a MR image from the first and second MR echo signals, whereby signal contributions from water protons and fat protons are separated.

\* \* \* \* \*